US007786437B2

(12) United States Patent
Toyoda et al.

(10) Patent No.: US 7,786,437 B2
(45) Date of Patent: Aug. 31, 2010

(54) PATTERN INSPECTION METHOD AND PATTERN INSPECTION SYSTEM

(75) Inventors: Yasutaka Toyoda, Hitachi (JP); Yasunari Souda, Kawasaki (JP); Yuji Takagi, Kamakura (JP); Koji Arai, Fukuyama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 204 days.

(21) Appl. No.: 12/188,096

(22) Filed: Aug. 7, 2008

(65) Prior Publication Data

US 2009/0039261 A1 Feb. 12, 2009

(30) Foreign Application Priority Data

Aug. 10, 2007 (JP) ............................ 2007-209789

(51) Int. Cl.
*G01N 23/00* (2006.01)
*G06K 9/00* (2006.01)

(52) U.S. Cl. ....................... 250/310; 250/306; 250/307; 382/149; 382/199; 382/242

(58) Field of Classification Search ................. 250/306, 250/307, 310, 311, 397, 399, 492.3; 382/145, 382/149, 181, 190, 195, 199, 203, 206, 242
See application file for complete search history.

(56) References Cited

U.S. PATENT DOCUMENTS 5,475,766 A * 12/1995 Tsuchiya et al. ............ 382/144
6,347,150 B1 * 2/2002 Hiroi et al. .................. 382/149
6,772,089 B2 * 8/2004 Ikeda et al. ................. 702/159
7,321,680 B2 * 1/2008 Ikeda et al. ................. 382/145
7,394,066 B2 * 7/2008 Murakoshi et al. .......... 250/310
7,681,159 B2 * 3/2010 Matsuoka et al. .............. 716/6
2002/0094120 A1 * 7/2002 Hiroi et al. .................. 382/149
2002/0117635 A1 * 8/2002 Shinada et al. ........... 250/492.3

(Continued)

FOREIGN PATENT DOCUMENTS

JP 63-122217 A 5/1988

(Continued)

OTHER PUBLICATIONS

Japanese Office Action dated Dec. 8, 2009 (Four (4) pages).

*Primary Examiner*—Bernard E Souw
(74) *Attorney, Agent, or Firm*—Crowell & Moring, LLP

(57) ABSTRACT

A pattern data examination method and system capable of accurately and speedily examining a circuit pattern without failing to extract pattern contour data are provided. While pattern comparison is ordinarily made by using a secondary electron image, a contour of a pattern element is extracted by using a backscattered electron image said to be suitable for observation and examination of a three dimensional configuration of a pattern element, and pattern inspection is executed by using the extracted contour of the pattern element. More specifically, pattern inspection is executed by comparing a contour of a pattern element with design data such as CAD data to measure a difference between the contour and the data, and by computing, for example, the size of the circuit pattern element from the contour of a pattern. From two or more backscattered electron images formed by detecting backscattered electrons at two or more different spatial positions, pattern contour data contained in the backscattered electron images may be obtained.

20 Claims, 16 Drawing Sheets

100
103
102
105
106
109
104
112
107
108
110
111
101
117
Processing control section
115
CPU
151
Image memory
LSI
153
152
A/D
113
114
125
130
Design system
Image taking recipe preparation system
116
Computer
123
119 Stage control section
121 Focus control section
120 Deflection control section

U.S. PATENT DOCUMENTS

| | | | | |
|---|---|---|---|---|
| 2003/0164460 | A1* | 9/2003 | Shinada et al. | 250/492.3 |
| 2004/0222377 | A1* | 11/2004 | Shinada et al. | 250/310 |
| 2006/0011835 | A1* | 1/2006 | Murakoshi et al. | 250/310 |
| 2006/0017014 | A1* | 1/2006 | Shinada et al. | 250/492.1 |
| 2006/0215901 | A1 | 9/2006 | Nakagaki et al. | |
| 2007/0181808 | A1* | 8/2007 | Murakoshi et al. | 250/310 |
| 2007/0210252 | A1* | 9/2007 | Miyamoto et al. | 250/310 |
| 2008/0058977 | A1* | 3/2008 | Honda | 700/110 |
| 2008/0175469 | A1* | 7/2008 | Toyoda et al. | 382/149 |
| 2009/0052765 | A1* | 2/2009 | Toyoda et al. | 382/149 |

FOREIGN PATENT DOCUMENTS

| | | | |
|---|---|---|---|
| JP | 6-96214 | A | 4/1994 |
| JP | 6-243814 | A | 9/1994 |
| JP | 11-343094 | A | 12/1999 |
| JP | 2000-260380 | A | 9/2000 |
| JP | 2005-277395 | A | 10/2005 |
| JP | 2006-269489 | A | 10/2006 |
| JP | 2006-351746 | A | 12/2006 |

* cited by examiner 100
103
102
105
106
104
107
108
109
110
111
101
117
112
A/D
A/D
A/D
113
114
Processing control section
115
CPU
151
LSI
153
Image memory
152
125
130
Design system
Image taking recipe preparation system
116
Computer
123
119
Stage control section
121
Focus control section
120
Deflection control section 401
Design layout
402
FP (Focusing point)
403
AP (Addressing point)
404
BP (Brightness/Contrast point)
405
EP (Inspection point)
406
SP
(Automatic astigmatism correction point)

BSE-L

BSE-R

Combined BSE image

SE Image

Contour line extraction result (1) Method 1
Combining (Selecting higher-luminance pixels)
Processing for detecting edge in line form is effective (2) Method 2
Combining (Selecting lower-luminance pixels)
Processing for detecting stepped edge is effective Combined BSE image Combined BSE image Contour line extraction result SE image contour line SE image BSE contour line
2201

Combined BSE image

Pattern

FIG. 23

| Image taking condition | Wafer condition | Image from which contour is to be extracted |
|---|---|---|
| A | a | BSE(L+R) |
| B | a | BSE(L+R) |
| C | b | BSE(L+R) |
| D | b | SE |
| E | c | SE |
| F | c | SE+BSE(L+R) |

PATTERN INSPECTION METHOD AND PATTERN INSPECTION SYSTEM

BACKGROUND OF THE INVENTION

1. Field of the Invention

The present invention relates to a pattern inspection method and a pattern inspection system and, more particularly, to a pattern inspection method and a pattern inspection system for examining a pattern formed on a substrate by using a photographic image of a semiconductor circuit and design data of the semiconductor circuit.

2. Background Art

In recent years, the development of semiconductor devices manufactured by finer patterning, having increased numbers of layers in multiplayer structure and complicated in logic has been pursued. In the present circumstances, it is extremely difficult to manufacture such semiconductor devices. As a result, the occurrence of defects coming from manufacturing processes tends to increase, and it is important to efficiently and correctly detect such defects and to identify manufacturing process problems.

The kinds of possible defects from a manufacturing process include deformation, breakage and short circuit of a pattern. Such defects can be detected by comparison with a reference pattern having an ideal shape. More specifically, an operator selects a pattern element having an ideal shape from patterns formed on a wafer. An image of the pattern element is taken (as a reference pattern). Subsequently, an image of a pattern to be examined is taken; the positions of the image of the object to be examined and the reference pattern element are adjusted; and a difference therebetween is computed. If the pattern to be examined includes a defect, luminance information at a position corresponding to the defect differs from luminance information about the reference pattern element and, correspondingly, the amount of difference is increased. By utilizing this nature, a position at which a differential value equal to or larger than a certain value is exhibited is detected as a defect position.

Such inspection is carried out with a review scanning electron microscope (review SEM) such as one disclosed in JP Patent Application No. 11-343094 (1999). The review SEM irradiates a specimen with an electron beam and performs the above-described inspection by using an image formed by using secondary electrons and backscattered electrons emitted from the specimen surface. An ordinary review SEM has a secondary electron detector for detecting secondary electrons and a backscattered electron detector for detecting backscattered electrons. Signals from the respective detectors are formed as a secondary electron image and a backscattered electron image. Each of the electron images is seen in different ways due to the difference between the characteristics of electrons used to form the images. The secondary electron image is suitable for observation and inspection of a pattern configuration, while the backscattered electron image is suitable for observation and inspection of a three-dimensional configuration of a pattern. However, the backscattered electron detector cannot detect backscattered electrons from a portion of the pattern element shielded with the major portion of the pattern element as seen from the position at which the backscattered electron detector is disposed. Therefore, three dimensional configuration of the whole pattern element cannot be expressed from a backscattered electron image formed by one backscattered electron detector. To enable observation of details of a three-dimensional configuration of a pattern, therefore, backscattered electron detectors are disposed at very small intervals so as to surround a specimen, and a plurality of backscattered electron images emitted from the pattern are formed. In an ordinary review SEM, however, two or three backscattered electron detectors are provided by considering the equipment cost and the installation area and are disposed so as to surround a specimen to obtain a plurality of backscattered electron images. Images used for pattern inspection are selectively used according to inspection purposes in such a manner that ordinary pattern inspection is performed by inspection through secondary electron images while inspection of a three-dimensional configuration of a pattern or a defect is performed by using backscattered electron images.

In a case where a pattern with openings such as holes is inspected, emission of secondary electrons from a hole area is weak. In such a case, an inspection method such as disclosed in JP Patent Publication (Kokai) No. 2000-260380 is used in which a backscattered electron image is blended at a certain ratio with a secondary electron image in an image of a hole area.

A mode of inspection using a reference pattern taken as an image as disclosed in JP Patent Application No. 11-343094 (1999) and JP Patent Publication (Kokai) 2000-260380 requires a user operation to register the reference pattern and, therefore, entails a problem in that a considerably long time is required for the reference pattern registering operation if patterns of various configurations are inspected.

Trials have therefore been made to automate the reference pattern registering operation and reduce the inspection time by adopting a method of using design data for a semiconductor device for a reference pattern and detecting a defect by comparing the design data and a pattern. For example, JP Patent Publication (Kokai) No. 2005-277395 discloses detection of a defect through comparison between design data and a pattern. More specifically, a manufactured semiconductor structure is irradiated with an electron beam; a contour line in a pattern is extracted by image processing from a secondary electron image formed by detecting secondary electrons emitted from the surface of the semiconductor structure; the contour line and the corresponding shape according to design data is compared with each other; and a portion of the pattern having a difference in shape is detected as a defect.

SUMMARY OF THE INVENTION

However, there is a possibility of the contrast of the secondary electron image varying largely under the influence of electrification caused on the semiconductor surface by irradiation with the electron beam. Therefore, even the method disclosed in JP Patent Publication (Kokai) No. 2005-277395 entails difficulty in extraction of a pattern contour line by image processing and, hence, difficulty in comparing design data and the contour line.

On the other hand, backscattered electron images used in a review SEM or the like has such a characteristic as to be unsusceptible to electrification in comparison with secondary electron images. With backscattered electron images, however, there is a problem that the shape of a portion of pattern element shielded with the major portion of the pattern element cannot be expressed because of the characteristics of backscattered electrons, as described above. Presently, therefore, backscattered electron images are not used as an image for comparison with design data.

The present invention has been achieved in view of these circumstances, and an object of the present invention is to provide a pattern data examination method and system capable of accurately and speedily examining a circuit pattern without failing to extract pattern contour data.

(1) To achieve the above-described object, a contour of a pattern element is extracted by using a backscattered electron image said to be suitable for observation and inspection of a three-dimensional configuration of a pattern, while pattern comparison is ordinarily made by using a secondary electron image. Pattern inspection is executed by using the extracted contour of the pattern element. More specifically, pattern inspection is executed by comparing a contour of a pattern element with design data such as CAD data to measure a difference between the contour and the data, and by computing, for example, the size of the circuit pattern element from the contour of a pattern.

(2) That is, a pattern inspection method in accordance with the present invention is a method in which a circuit pattern on a specimen manufactured on the basis of design data for an electronic device is examined by comparison between the design data and an image of the circuit pattern, and which is characterized by including a step in which the specimen is irradiated with an electron beam, backscattered electrons emitted from the specimen are detected by a backscattered electron detector, and backscattered electron image forming means forms a backscattered electron image by using the detected backscattered electrons, and a step in which contour extraction means extracts contour data on a contour in the circuit pattern from the backscattered electron image formed. This method is implemented, for example, as software. In such a case, the above-described backscattered electron image forming means and contour extraction means are implemented by means of a computer such as a processing control section or a CPU according to a program.

In the present invention, two or more backscattered electron detectors may be disposed to detect backscattered electrons at different spatial positions and form two or more backscattered electron images. In such a case, circuit pattern contour data is extracted from a combined image obtained by combining the two or more backscattered electron images. To extract the contour data, inter-image computational processing on the two or more backscattered electron images is executed. As the inter-image computational processing, any one of the following three steps is executed. 1) first computational processing for comparing the two or more backscattered electron images and selecting the backscattered electron image having a higher gray-level value as the combined image of the backscattered electrons, 2) second computational processing for comparing the two or more backscattered electron images and selecting the backscattered electron image having a lower gray-level value as the combined image of the backscattered electrons, and 3) third computational processing for generating a gray-level value of the combined image of the backscattered electrons by adding together the gray-level values of the two or more backscattered electron images in even or uneven proportions.

(3) A pattern inspection method according to another aspect of the present invention is a method in which a circuit pattern on a specimen manufactured on the basis of design data for an electronic device is examined by comparison between the design data and an image of the circuit pattern, and which is characterized by including a step in which the specimen is irradiated with an electron beam, backscattered electrons emitted from the specimen are detected by a backscattered electron detector, and backscattered electron image forming means forms a backscattered electron image by using the detected backscattered electrons, a step in which secondary electrons emitted from the specimen are detected by a secondary electron detector, and secondary electron image forming means forms a secondary electron image by using the detected secondary electrons, and a step in which contour extraction means extracts contour data on a contour in the circuit pattern from the backscattered electron image and the secondary electron image.

Also in this aspect, two or more backscattered electron detectors may be disposed to detect backscattered electrons at different spatial positions and form two or more backscattered electron images. In such a case, the contour extraction means forms a combined image from two or more backscattered electron images and a secondary electron image by using inter-image computational processing and extracts circuit pattern contour data from the combined image. As the inter-image computational processing, any one of the following three steps is executed. 1) first computational processing for comparing the two or more backscattered electron images and the secondary electron image and selecting the backscattered electron image having a higher gray-level value or the secondary electron image as the combined image of the backscattered electrons, 2) second computational processing for comparing the two or more backscattered electron images and the secondary electron image and selecting the backscattered electron image having a lower gray-level value or the secondary image as the combined image of the backscattered electrons, and 3) third computational processing for generating a gray-level value of the combined image of the backscattered electrons by adding together the gray-level values of the two or more backscattered electron images and the secondary electron image in even or uneven proportions.

(4) Pattern inspection is executed by comparing the extracted contour data and the design data. For example, a difference between the contour data and the pattern according to the design data is measured; a portion of the pattern is detected as a defective portion if the portion has as the measured value a value larger than a prescribed value; and a circuit pattern size of a circuit pattern spacing size on the specimen is computed from the contour data.

(5) The backscattered electron image, the contour data and the design data may be displayed in a state of being overlaid on each other or arranged side by side on a screen of a display unit.

(6) The specimen is a mask or a silicon wafer. The two or more backscattered electron detectors are disposed at substantially equal intervals so as to surround the specimen. For example, three backscattered electron detectors are provided and disposed at intervals of about 120 degrees from each other.

Also, the inter-image computational processing may include smoothing of the combined image, whereby noise superimposed on the combined image is reduced and luminance-changed portions of the pattern in the combined image are reduced.

(7) The present invention provides a pattern inspection system corresponding to the above-described pattern inspection method. Other features of the present invention will become apparent from the best mode of carrying out the invention described below with reference to the accompanying drawings.

According to the present invention, contour data for a pattern is extracted from backscattered electron images unsusceptible to electrification and the pattern is examined by comparison with the design data. As a result, an increase in semiconductor circuit observation time due to measures against electrification and failure to extract contour data due to an image disturbance caused by electrification can be avoided, and semiconductor device examination can be performed speedily and accurately.

BRIEF DESCRIPTION OF THE DRAWINGS

FIG. 23 is a diagram showing table data for changing images from which contour lines are extracted, according to semiconductor wafer image taking conditions and wafer conditions.

DESCRIPTION OF SYMBOLS

Figure 1:
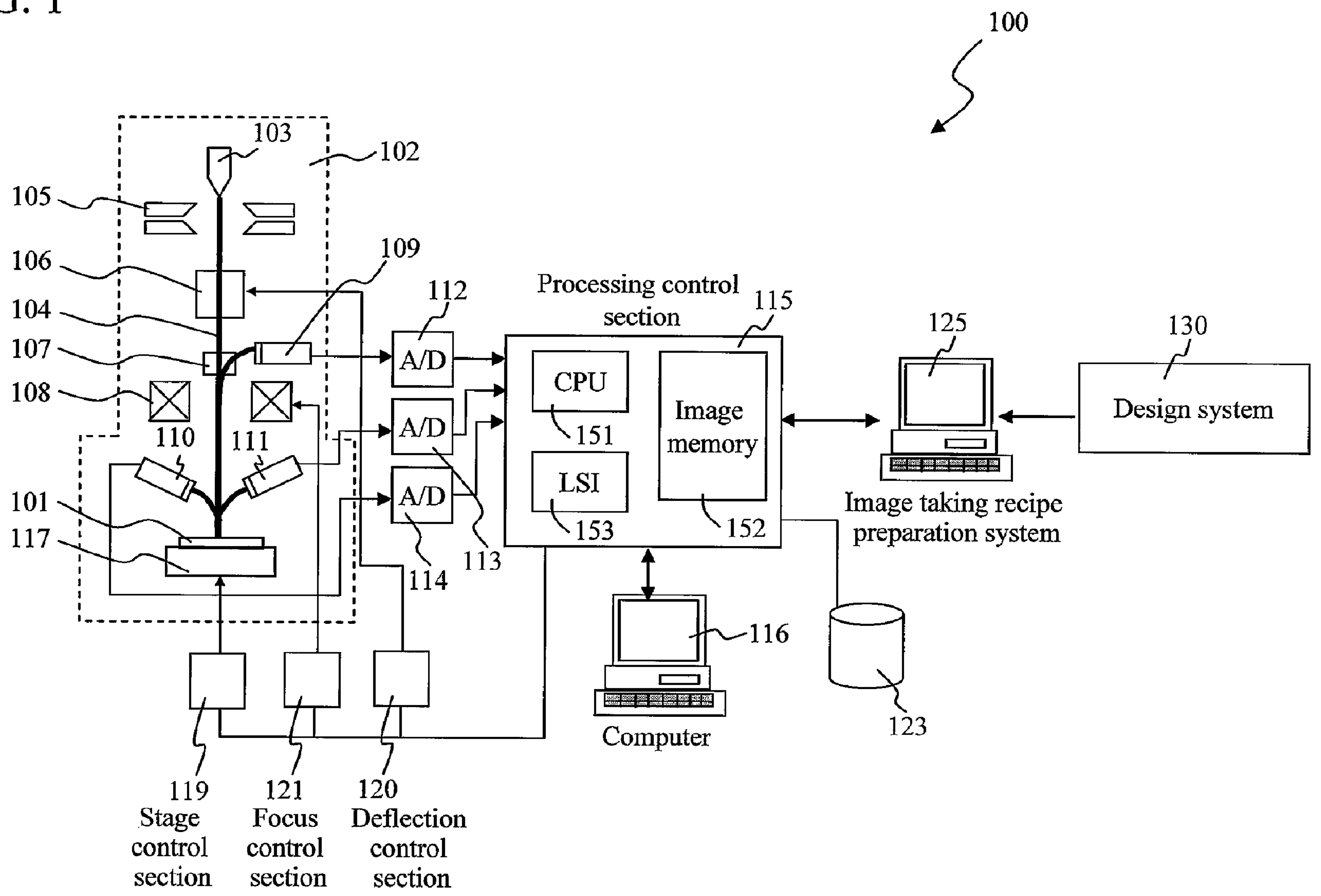
FIG. 1 is a diagram schematically showing the configuration of a pattern inspection system in accordance with the present invention.

100 Pattern inspection system
101 Semiconductor wafer
102 Electronic optical system
103 Electron gun
104 Primary electrons
105 Condenser lens
106 Deflector
107 E×B deflector
108 Objective lens
109 Secondary electron detector
110, 111 Backscattered electron detector
112, 113, 114 A/D converter
115 Processing control section
151 CPU
152 Image memory
153 LSI
116 Computer
117 Stage
119 Stage controller
120 Deflection control section
121 Focus control section
123 Storage
125 Image taking recipe preparation section
130 Design system
201, 202, 203 Scanning with electron beam in x-direction
204, 205, 206 Scanning with electron beam in y-direction
401 Design layout
402 Focusing point
403 Addressing point
404 Brightness/contrast point
405 Examination point
406 Automatic astigmatism correction point
601 Backscattered electron detector (L)
602 Backscattered electron detector (R)
701 Pattern portion expressed as white line
702 Pattern portion expressed by stepped-luminance-change portion
1701 Contour data
1702 Design data
1801 Straight line constituting contour data
1802 Straight line constituting design data
1803 Distance between design data and contour line data
1804 Pattern cut portion
1805 Pattern short circuit portion
1901 Display screen
1902 BSE image display view
1903 Combined BSE image display view
1904 Examination state display view
1905 Examination result display view
1906 On-wafer examination point display view
2201 Contour line extraction failure portion

DETAILED DESCRIPTION OF THE PREFERRED EMBODIMENTS

Embodiments of the present invention will be described with reference to the accompanying drawings. It is to be noted that the embodiments described below are only examples of implementation of the present invention, and that the embodiments do not limit the technical scope of the invention. Constituent elements common to the drawings are indicated by the same reference numerals.

First Embodiment (1) Configuration of a Pattern Inspection System Using SEM

FIG. 1 is a diagram schematically showing the configuration of a pattern inspection system 1 in accordance with the present invention. The pattern inspection system 100 is provided with a scanning electron microscope (SEM) capable of obtaining a backscattered electron (BSE) image and a secondary electron (SE) image of a semiconductor pattern. An electron optical system 102 of the SEM has an electron gun 103 which produces an electron beam (primary electrons) 104, a condenser lens 105 which converges the electron beam 104 generated from the electron gun 103, a deflector 106 which deflects the converged electron beam 104, an E×B deflector 107 for detecting secondary electrons, and an objective lens 108 which focuses the converged electron beam on a semiconductor wafer 101. The semiconductor wafer 101 is placed on an XY stage 117. With the deflector 106 and the objective lens 108, the electron beam application position and the aperture are controlled so that the electron beam is applied and focused to a desired point on the semiconductor wafer 101 placed on the XY stage 117. With the XY stage 117, the semiconductor wafer 101 is moved to enable taking an image of the semiconductor wafer 101 at desired position. Accordingly, changing the observation position by means of the XY stage 117 is referred to as stage shifting, while changing the observation position by deflecting the electron beam by means of the deflector 106 is referred to as beam shifting.

From the semiconductor wafer 101 to which the electron beam is applied, secondary electrons and backscattered electrons are emitted. The secondary electrons are detected by a secondary electron detector 109. The backscattered electrons are detected by backscattered electron detectors 110 and 111. The backscattered electron detectors 110 and 111 are disposed at positions different from each other. The secondary electrons and backscattered electrons detected by the secondary electron detector 109 and the backscattered electron detectors 110 and 111 are converted into digital signals by A/D converters 112, 113, and 114 to be input to a processing control section 115 and stored in an image memory 152. Image processing is performed on the stored secondary electrons and backscattered electrons by means of components such as a central processing unit (CPU) 151 and image processing hardware 153 according to a purpose, thereby examining a semiconductor pattern. That is, the processing control section 115 sends control signals to a stage controller 119 and a deflection control section 120 to take images at an addressing point (AP), a focusing point (FP), an astigmatism point (SP), a brightness/contrast point (BP) and an examination point (EP) described below on the basis of an image taking recipe prepared in an image taking recipe preparation section 125 described below, and showing a pattern inspection procedure, and examines the semiconductor pattern by performing processing and control including various kinds of image processing and the like on the observed image on the semiconductor wafer 101.

The processing control section 115 is connected to the stage controller 119, the deflection control section 120 and a focus control section 121. The stage controller 119 performs control of the position and movement of the stage 117 including global alignment control for correcting an origin misalignment and rotation of the semiconductor wafer 101 by observing global alignment marks on the semiconductor wafer 101 through an optical microscope (not shown) or the like. The deflection control section 120 controls beam shifting of the electron beam (beam deflection) by controlling the deflector 106. The focus control section 121 performs focus control by controlling the objective lens 108.

The processing control section 115 is also connected to a computer (including a display) 116 having input means to have the functions of a graphical user interface (GUI) or the like for displaying images, examination results, etc., to a user. While an example of the system having two backscattered electron image detectors has been described, the number of backscattered electron image detectors can be increased. Also, processing and control in the processing control section 115 can be performed by assigning part or the whole of control in the processing control section 115 to the computer 116 or the like incorporating a CPU and a memory capable of storing images.

Further, the processing control section 115 is connected via a network, a bus or the like to the image taking recipe preparation section 125 that prepares an image taking recipe including information such as the coordinates of one of or a plurality (or all) of the below-described AP, FP, SP, BP and EP, a design data template for positioning corresponding to the coordinates, and SEM observation conditions (including the image taking magnification and image quality). The image taking recipe preparation section 125 is connected via a network or the like to a design system 130 such as an electronic design automation (EDA) tool to obtain design data. The image taking recipe preparation section 125 prepares an image taking recipe from information on image taking points of the semiconductor wafer to be examined, by using design data. The image taking recipe preparation section 125 corresponds to an image taking recipe preparation apparatus disclosed in JP Patent Publication (Kokai) No. 2006-351746 for example. However, the concept of preparation of an image taking recipe from design data itself has been proposed for a long time. The method and apparatus for producing an image taking recipe from design data are not restrictively specified in the present invention. In ordinary cases, preparation of an image taking recipe is executed by means of software processing in an electronic computer including a CPU and a memory or hardware processing using hardware including a CPU, an application specific integrated circuit (ASIC), a field programmable gate array (FPGA) and a memory.

(2) About Visualization of Detected Electrons

Figure 2A:
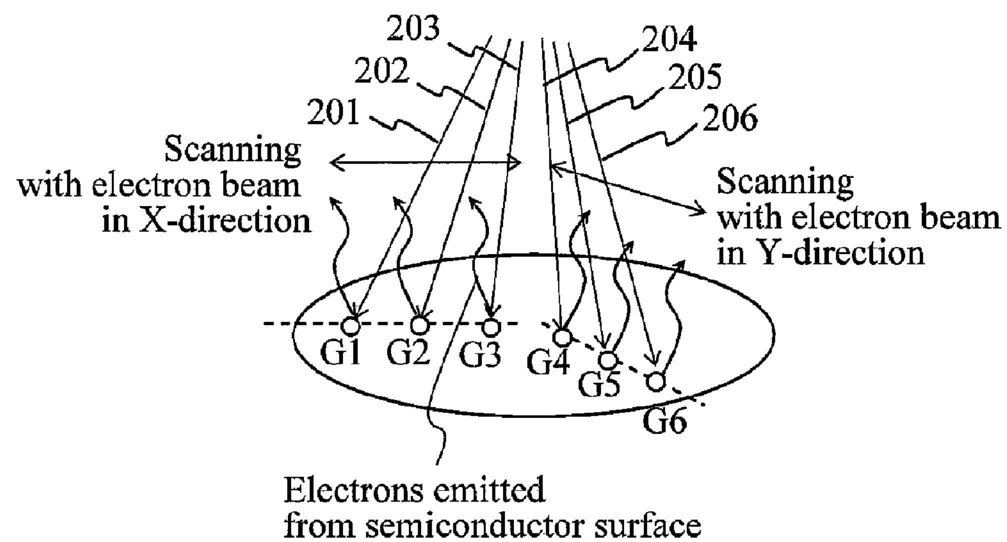
FIGS. 2A and 2B are diagrams showing a procedure for forming a secondary electron image and a backscattered electron image.
Figure 2B:
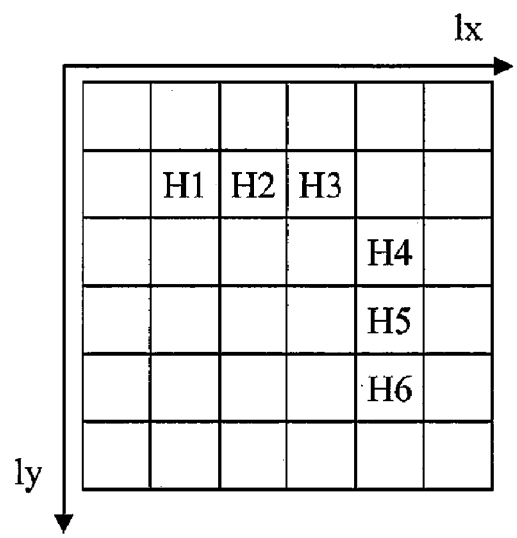

FIG. 2 is a diagram for explaining a method of visualizing the amounts of signals obtained from electrons emitted from the surface of the semiconductor wafer when the surface of the semiconductor wafer is irradiated and scanned with the electron beam. Application of the electron beam for irradiation and scanning is performed in the x- or y-direction, for example, as indicated by lines 201 to 203 or lines 204 to 206 in FIG. 2A. The direction of scanning can be changed by changing the direction of deflection of the electron beam.

In FIG. 2A, G1 to G3 respectively indicate points on semiconductor wafer to which electron beams 201 to 203 in scanning in the x-direction are applied. Similarly, G4 to G6 respectively indicate points on semiconductor wafer to which electron beams 204 to 206 in scanning in the y-direction are applied. The amounts of signals obtained from secondary electrons emitted in G1 to G6 are converted into brightness values of pixels H1 to H6 in the image coordinate system shown in FIG. 2B through the secondary electron detector and the AD converter, while the amounts of signals obtained from backscattered electrons emitted in G1 to G6 are converted into brightness values of pixels H1 to H6 through the backscattered electron detectors and the AD converter (subscripts after G and H corresponding to each other). An SE image is formed from the amounts of signals obtained from the secondary electrons, while a BSE image is formed from the amounts of signals obtained from the backscattered electrons.

(3) About Image Taking Sequence

Figure 3:
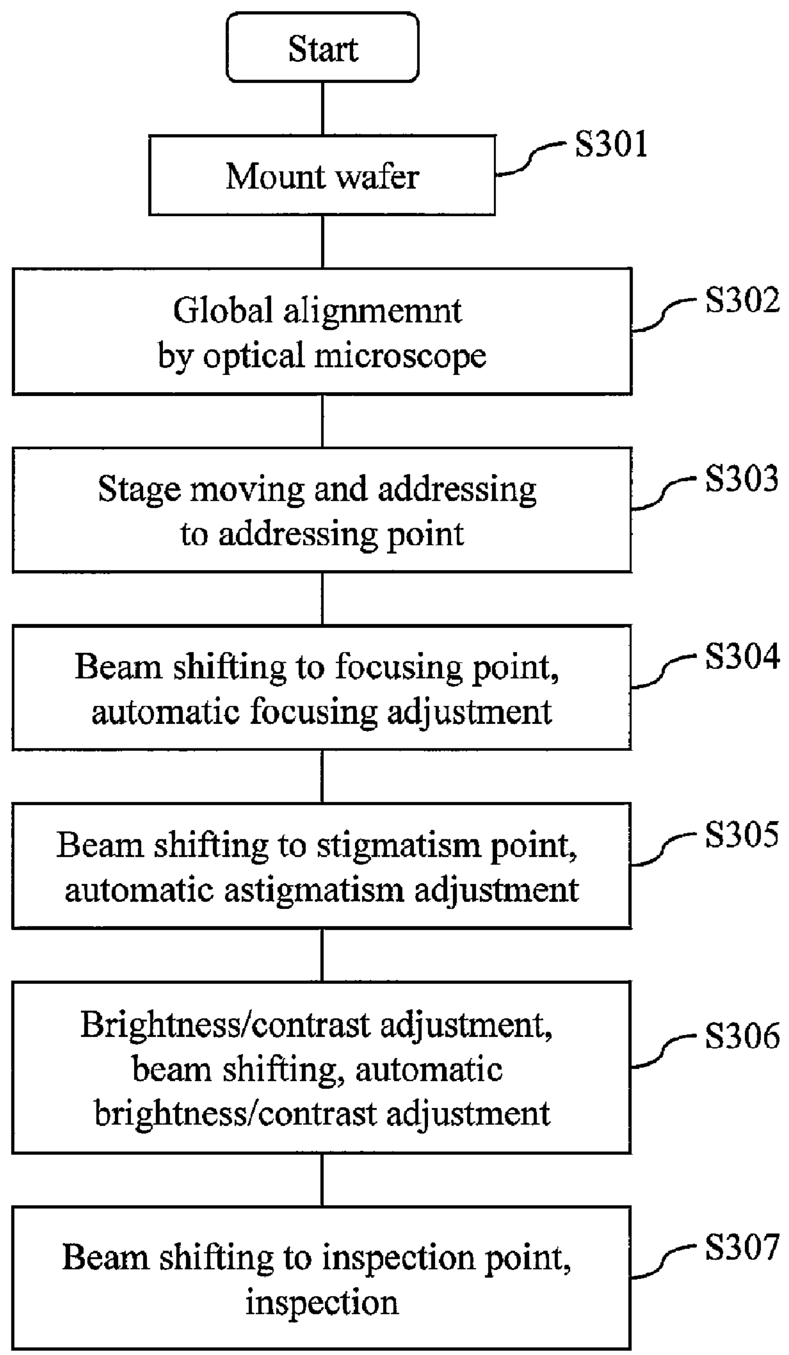
FIG. 3 is a flowchart showing a pattern inspection procedure in the pattern inspection system in accordance with the present invention.
Figure 4:
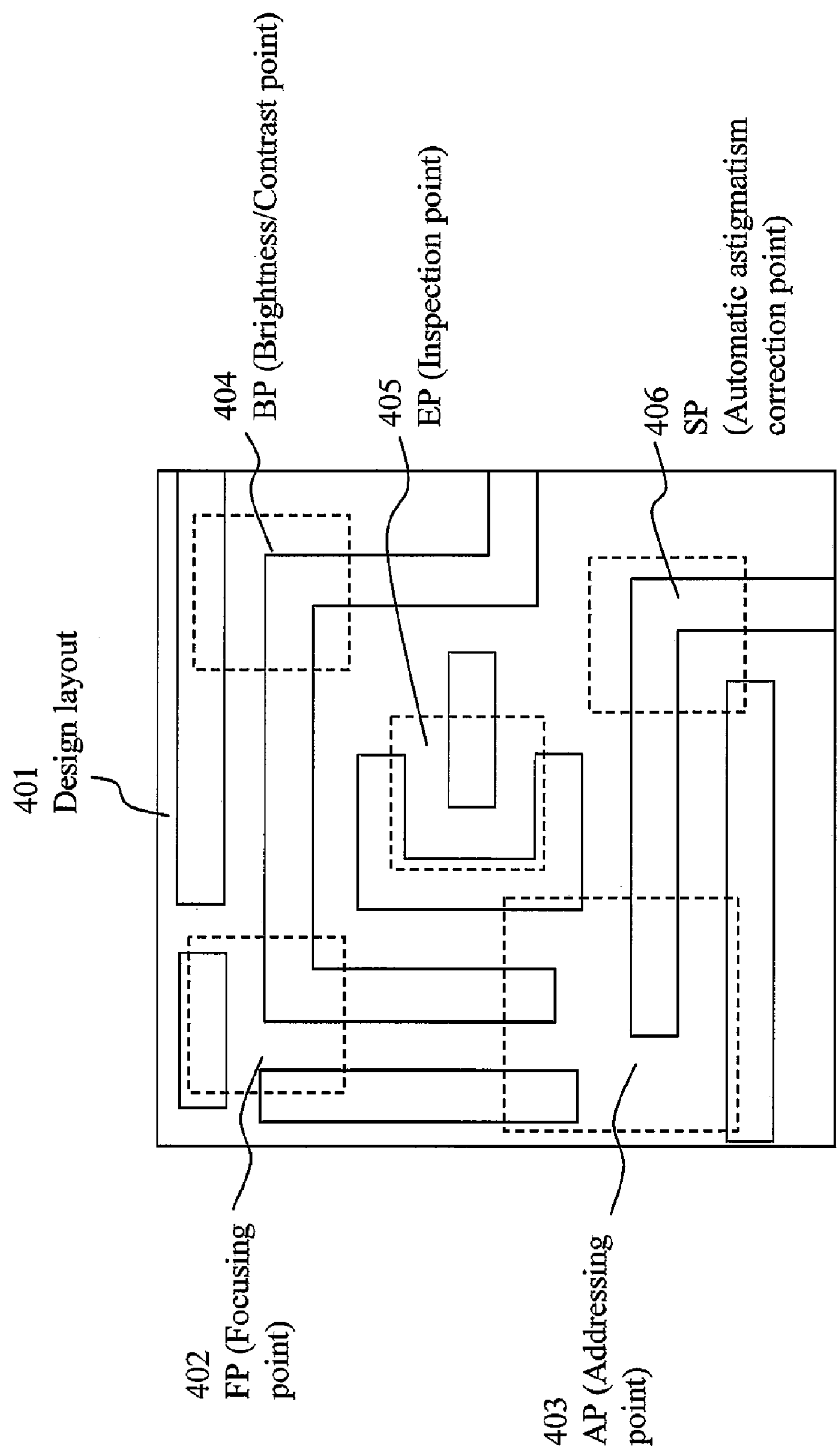
FIG. 4 is a diagram showing an example of an automatic focusing point, an astigmatism point and other points on a design layout required for taking an image at an examination point on a semiconductor wafer.

FIG. 3 is a diagram for explaining an image taking sequence for observation of an arbitrary EP on the wafer. FIG. 4 is a diagram showing an example of setting AP 403, FP 402, SP 406 and BP 404 with respect to EP 405 on a design layout. Image taking positions and image taking conditions (including the image taking magnification and image quality) in the image taking sequence and examination conditions at the EP are prepared as an image taking recipe in the image taking recipe preparation section 225 on the basis of design data and examination point information and are managed by being stored in a storage 123 for example.

Referring to FIG. 3, the semiconductor wafer 101 is first mounted on the stage 117 (S301). Subsequently, an origin misalignment and a rotational misalignment of the specimen are computed by the processing control section 115 on the basis of the results of observation of global alignment marks on the specimen through an optical microscope or the like (not shown) and the misalignments are corrected by controlling the stage 117 on the basis of the amounts of these misalignments by means of the stage controller 119 (S302).

Next, the processing control section 115 controls the stage 117 to move the image taking position to the AP according to the coordinates of the image taking points and image taking conditions prepared by the image taking recipe preparation section 125, and performs image taking at an image taking magnification lower than that at the time of EP image taking (S303). Description about the AP is made below. Direct observation of the EP entails a problem in that a portion to be observed may deviate from the field of view of the SEM due to the stage positioning accuracy for example. To solve this problem, the processing control section 115 temporarily observes the AP that has been prepared in advance in the image taking recipe preparation section 125 for positioning and registered in the storage 123 and whose coordinates are known, and performs matching between the design data template at the AP prepared in advance by the image taking recipe preparation section 125 and registered in the storage 123 and the SEM image at the AP observed. A shift vector between the center coordinates of the design data template and the center coordinates at the time of actual observation at the AP is thereby detected. Subsequently, the processing control section 115 shifts the beam (changes the application position by inclining the beam incidence direction) by an amount corresponding to the result of subtraction of the detected shift vector from the relative vector between the coordinates of the design data template and the coordinates of the EP by controlling the deflector 106 through the deflection control section 120. The processing control section 115 thereby moves the image taking position and observes the EP, thus enabling image taking at the EP with high coordinate accuracy. (The beam shift positioning accuracy is ordinarily higher than the stage positioning accuracy.)

The image taking position is moved to the FP by beam shifting on the basis of control and processing performed by the processing control section 115 and images are taken to obtain automatic focusing parameters, and automatic focusing is performed on the basis of the obtained parameters (S304).

Subsequently, the image taking position is moved to the SP by beam shifting on the basis of control and processing performed by the processing control section 115 and images are taken to obtain astigmatism correction parameters, and automatic astigmatism correction (automatic stigmatism correction) is performed on the basis of the obtained parameters (S305).

Further, the image taking position is moved to the BP by beam shifting on the basis of control and processing performed by the processing control section 115 and images are taken to obtain brightness/contrast adjustment parameters, and automatic brightness/contrast adjustment is performed on the basis of the obtained parameters (S306). Part or all of addressing, automatic focusing, automatic astigmatism correction and automatic brightness/contrast adjustment in the above-described steps S303, S304, S305 and S306 are omitted in some case. The order of the steps S303, S304, S305 and S306 may alternatively be changed as required. Other variations of these operations are conceivable. For example, some of the coordinates of the AP, FP, SP and BP may coincide with each other (for example, automatic focusing and automatic astigmatism correction are performed at the same position).

Finally, the image taking position is moved to the EP by beam shifting on the basis of control and processing performed by the processing control section 115, and images are taken to examine the pattern (S307).

(4) About Pattern Inspection Processing

Figure 5:
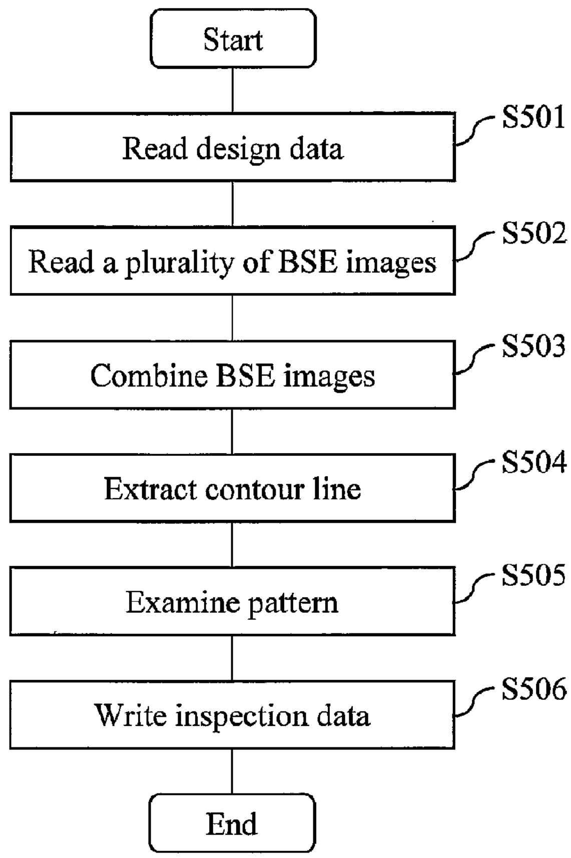
FIG. 5 is a flowchart for explaining pattern inspection processing according to the first embodiment of the present invention.

FIG. 5 is a flowchart for explaining pattern inspection processing in accordance with the present invention. This pattern inspection processing is executed by means of software processing using the CPU 151, the image memory 152 and the like of the processing control section 115. However, this pattern inspection processing may alternatively be executed by means of software processing using a CPU, a memory and other components of an electronic computer to which images from the SEM apparatus and the design data template from the image taking recipe preparation section 125 can be input via a LAN and a bus or a storage medium such as a portable memory device or a hard disk. Detailed description will be made of each block below.

Referring to FIG. 5, the processing control section 115 (CPU 151) first reads the design data template corresponding to the coordinates of the EP from the image taking recipe preparation system 125 (S501). Subsequently, the processing control section 115 (CPU 151) reads from the image memory 152 a plurality of BSE images at the EP taken from a plurality of viewing points (S502) and forms a combined BSE image by combining processing (S503). The processing control section 115 (CPU 151) extracts a contour line from the combined B SE image (S504) and examines the pattern by comparing the contour data and the design data (S505). Data (configuration information including the coordinate position and length) on a defect in the pattern detected by comparing the pattern configuration according to the design data and the pattern configuration according to the contour data as described above is written to the storage 123 for example (S506). Details of the processing from steps S503 to S505 will be described below.

(5) About Combined BSE Image and Combining Processing (S503)

Figure 6:
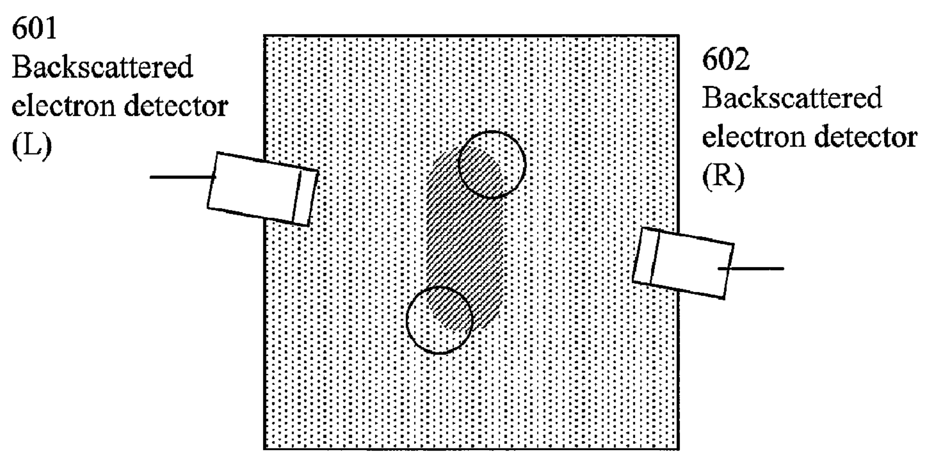
FIG. 6 is a diagram showing an example of disposition of backscattered electron detectors.
Figure 7A:
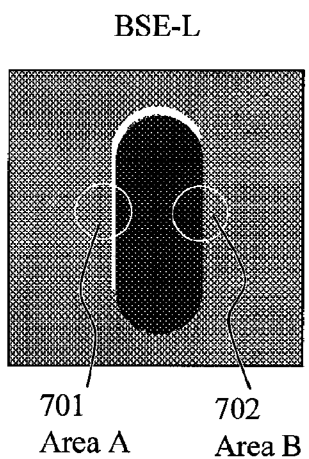
FIGS. 7A to 7C are diagrams showing backscattered electron images.
Figure 7B:
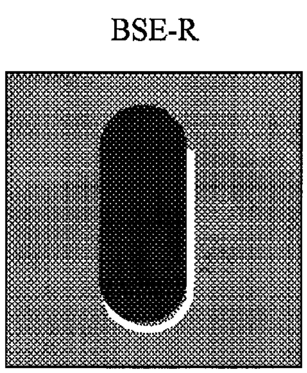

A combined BSE image and combining processing (step S503 in FIG. 5) will be described in detail. BSE images are formed by signals obtained from electrons backscattered after impinging on the backscattered electron detectors. The pattern is seen in different ways depending on the positions at which the backscattered electron detectors are disposed with respect to the pattern. For example, in a case where the two backscattered electron detectors 601 and 602 are disposed obliquely in left and right positions above the upper surface of a pattern element as shown in FIG. 6, backscattered electron images from the backscattered electron detectors 601 and 602 are as shown in FIGS. 7A and 7B. FIG. 7A shows a BSE-L image formed from backscattered electron information obtained by the backscattered electron detector (L) 601. FIG. 7B shows a BSE-R image formed from backscattered electron information obtained by the backscattered electron detector (R) 602. The backscattered electron detector (L) 601 can detect backscattered electrons emitted from a left side wall and an upper side wall of the pattern element but cannot detect backscattered electrons emitted from a right side wall and a lower side wall under the influence of irregularities of the pattern element. Therefore the backscattered electron detector (L) 601 obtains an image such as shown in FIG. 7A. In contrast with the backscattered electron detector (L) 601, the backscattered electron detector (R) 602 can detect backscattered electrons emitted from the right side wall and the lower side wall of the pattern element. Therefore the backscattered electron detector (R) 602 obtains a BSE-R image such as shown in FIG. 7B.

Figure 8A:
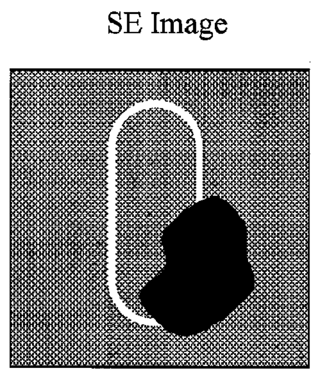
FIGS. 8A and 8B are diagrams showing methods 1 and 2 of forming a contour line from an image.
Figure 8B:
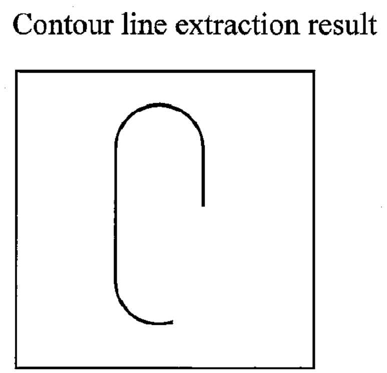

An SE image of the pattern element shown in FIG. 6 is as shown in FIG. 8A. The SE image is formed by collecting secondary electron signals emitted from the wafer surface by irradiating the wafer with the electron beam by utilizing an electric field produced by a voltage applied to the secondary electron detector. In the SE image, therefore, information on a pattern edge portion and projecting portion can be visualized without being influenced by irregularities as in the BSE images. In some case, however, the contrast in a portion of the image may be disturbed under the influence of electrification caused by irradiation of the pattern element with the electron beam, as shown in FIG. 8A, resulting in a state such as shown in FIG. 8B, where it is difficult to extract the contour of the pattern element.

Figure 7C:
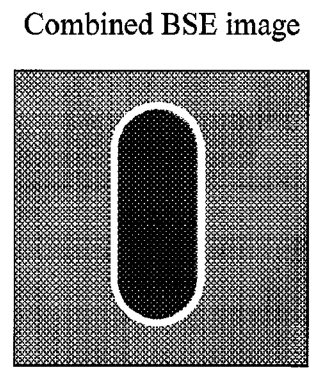

In comparison with an SE image, BSE images are not easily influenced by electrification. Therefore, BSE images are suitable for extracting pattern contour lines. However, failure to extract a contour line occurs at some position under the influence of irregularities of a pattern element in the case of using one BSE image formed by using one backscattered electron detector as described above. An image effective in extracting a contour line, such as the one shown in FIG. 7C, can be formed by combining a plurality of BSE images (e.g., the BSE-L image shown in FIG. 7A and the BSE-R image shown in FIG. 7B) obtained at a plurality of points.

Figure 9:
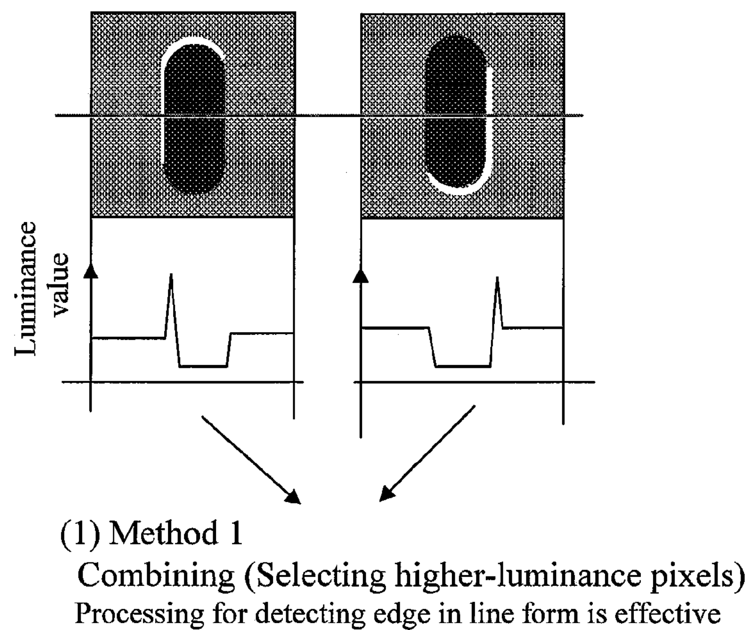
FIG. 9 is a diagram showing backscattered electron images.
Figure 9:
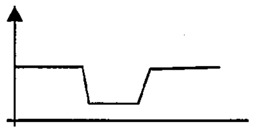
Figure 10A:
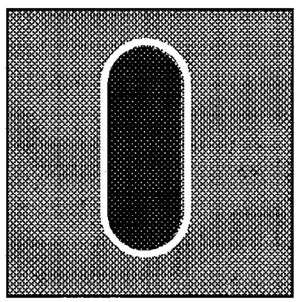
FIGS. 10A to 10C are diagrams showing combined backscattered electron images.
Figure 10B:
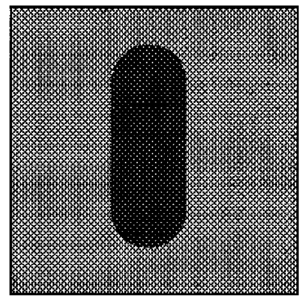
Figure 10C:
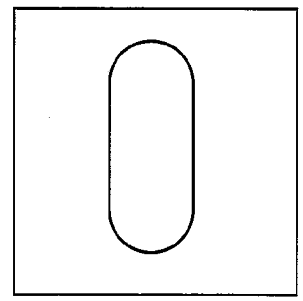

A BSE image is ordinarily a gray-scale image of 8 to 16 bits/pixel. Description will be made of BSE images by assuming that the BSE images are gray-scale images of 8 bits/pixel (0 (black) to 255 (white)) for ease of description. An ordinary BSE image is formed so that a portion of a high backscattered electron intensity is white, as in the pattern contour portion shown in FIG. 7A or 7B, while the other portions having low backscattered electron intensities are black. Also, there is a difference in luminance value between recesses and projections in a pattern. There are roughly two kinds of method of extracting pattern contour lines from such BSE images. One of them is a method of detecting a white line portion from a pattern as shown in area A 701 in FIG. 7A and forming a contour line on the basis of the detected portion (see method 1 shown in FIG. 9(1)). The other of them is a method of detecting a portion where the luminance value changes stepwise as shown in area B 702 in FIG. 7A, and forming a contour line on the basis of the detected portion (see method 2 shown in FIG. 9(2)). Since images suited for the different method used for contour line extraction are different from each other, different BSE image combining methods are used. For example, when the contour line extraction method of detecting a white line is used, combining processing is performed so as to leave a white line of a pattern element from a plurality of BSE images, as in a combined BSE image shown in FIG. 10A. When the contour line extraction method of detecting a portion where the luminance changes stepwise is used, combining processing for leaving a portion where the luminance changes stepwise as in a combined BSE image shown in FIG. 10B is performed.

Figure 11:
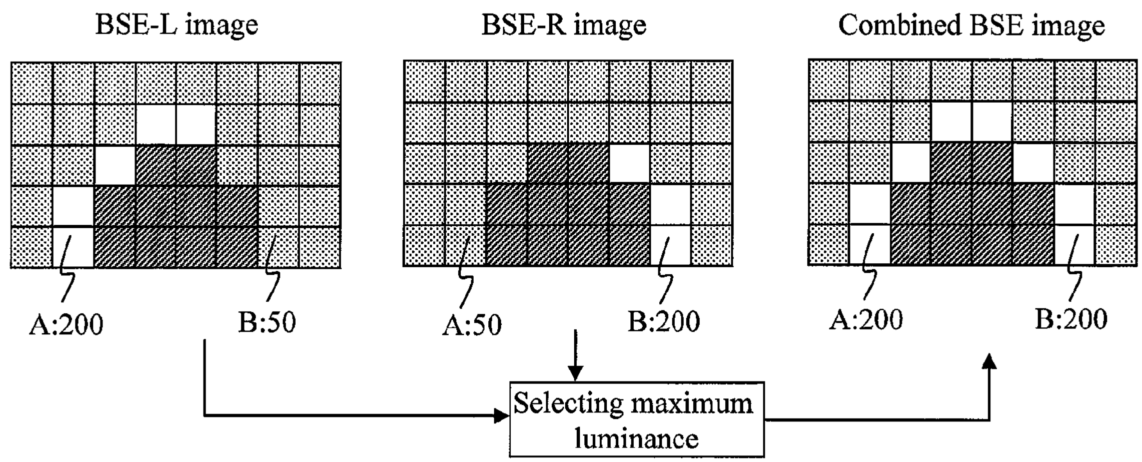
FIG. 11 is a diagram showing an example of combining of backscattered electron images.
Figure 12:
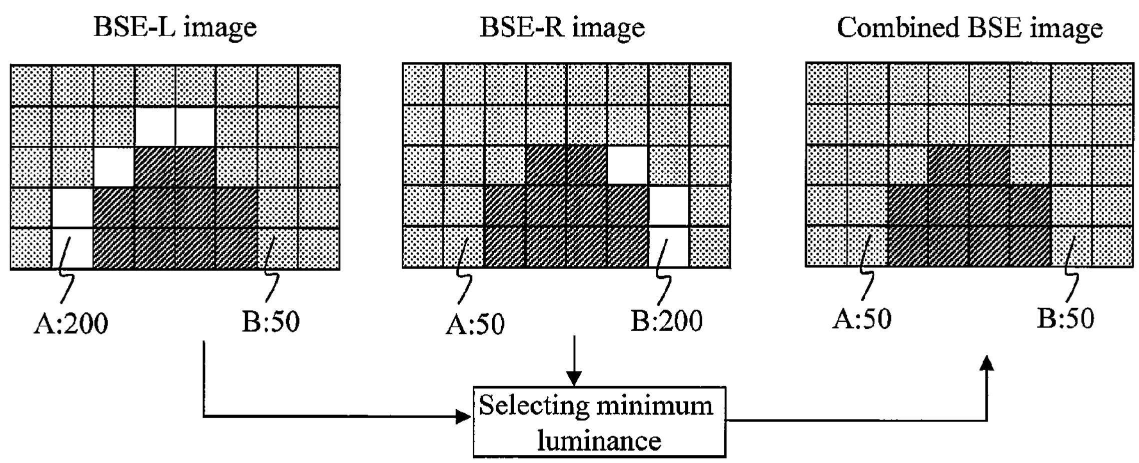
FIG. 12 is a diagram showing an example of combining of backscattered electron images.

As combining processing for detecting a white line, combining processing is performed by comparing the luminance values of pixels at positions on a pattern corresponding to each other between a plurality of BSE images as shown in FIG. 11 and by selecting the pixels having the highest luminance value as a luminance value in the result of the combining. Another effective combining means is summation, which is processing including adding together the luminance values of pixels at positions on a pattern corresponding to each other between a plurality of BSE images, dividing the addition result by the number of pixels having the pixel values added together, and obtaining the division result as a luminance value in the result of the combining. Summation of a plurality of images is an image combining means generally used for the purpose of reducing white noise (noise containing all frequency components) superimposed on the images. Summation may be applied to BSE images to enable forming a combined BSE image having a pattern white portion left therein as well as reducing white noise superimposed on the BES images. While an example of summation in which the luminance values of a plurality of BSE images occupying the pixel value after summation are equally proportioned has been described, a combined BSE image in which differences between the luminance ranges of a plurality of BSE images for example are corrected may be formed by differently weighting the pixel values of the plurality of BSE images and thereafter performing summation such as adding the pixel values. As combining processing for detecting a portion where the luminance changes stepwise, combining processing is performed by comparing the luminance values of pixels at positions on a pattern corresponding to each other between a plurality of BSE images as shown in FIG. 12 and by selecting the pixels having the lowest luminance value as a luminance value in the result of the combining.

Combined BSE images suitable for contour line extraction can be formed by taking BES images at a plurality of points and combining the BEE images by computational processing including comparison, addition and division. The above-described combining methods are not exclusively used. Any other combining method may suffice if a pattern portion contained in a single image and ineffective in contour line extraction to be applied is removed from BSE images taken at a plurality of points, or if a pattern portion effective in contour line extraction to be applied is enhanced.

Further, a combined image, such as that shown in FIG. 6, based on BSE images obtained by a small number of backscattered electron detectors has certain regions, such as those indicated in circles, where it is difficult to detect backscattered electrons. That is, the luminance value of a pattern in such regions tends to be lower than the luminance value of the pattern in other regions. Such a condition badly influences contour line extraction. Also, noise such as a thermal noise is superimposed on BSE images to badly influence contour line extraction. Therefore, smoothing and noise removal processing, e.g., those disclosed in the sections describing an improvement in image quality, image re-forming, smoothing and noise removal in "Computer Image Processing" written by Hideyuki Tamura (Ohmsha, December 2002) are therefore performed. By these kinds of processing, portions locally reduced in luminance can be reduced and noise superimposed on a combined BSE image can be suppressed, thus enabling a combined BSE image effective in contour line extraction to be formed.

Figure 13:
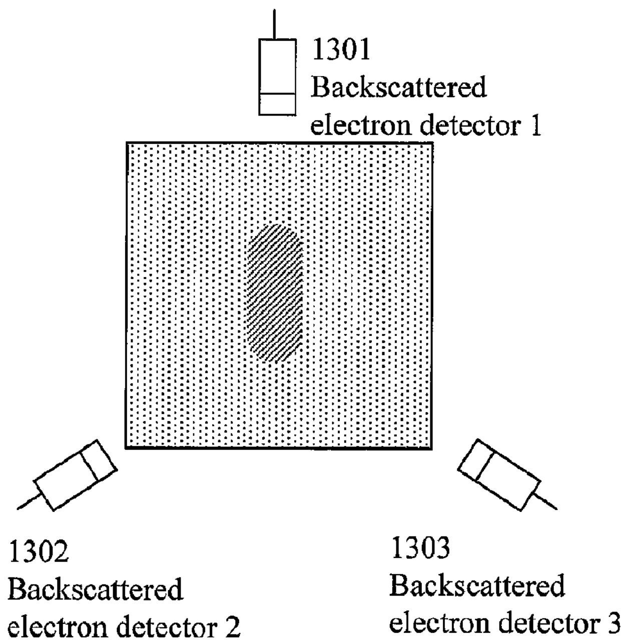
FIG. 13 is a diagram showing an example of disposition of backscattered electron detectors about a specimen.

An example of combining images by using two backscattered electron images obtained by two backscattered electron detectors disposed at 180° intervals about a specimen as shown in FIG. 6 has been described. However, if, for example, three backscattered electron detectors 1201 to 1203 are disposed at 120° intervals about a specimen as shown in FIG. 13, backscattered electrons emitted in various directions can be detected with stability. Three backscattered electron images obtained with this arrangement may be combined by the above-described method to form a combined BSE image suitable for contour line extraction. Even in such a case, it is desirable to apply smoothing, noise removal processing ("Computer Image Processing") to the combined BSE image because it is difficult to detect backscattered electrons from some portions.

The number of BSE images to be combined may be increased by disposing four or more backscattered electron detectors at intervals equal to or smaller than 120° to form an image suitable for contour line extraction. However, the manufacturing cost of the equipment is increased in such a case. It is desirable to adopt an arrangement according to an examination purpose and a moderate equipment cost. The number of backscattered electron detectors, the number of BSE images to be combined and the positions at which backscattered electron detectors are disposed are not limited to these in the above-described example.

(6) BSE Image Contour Line Extraction Processing (S504)

Figure 14:
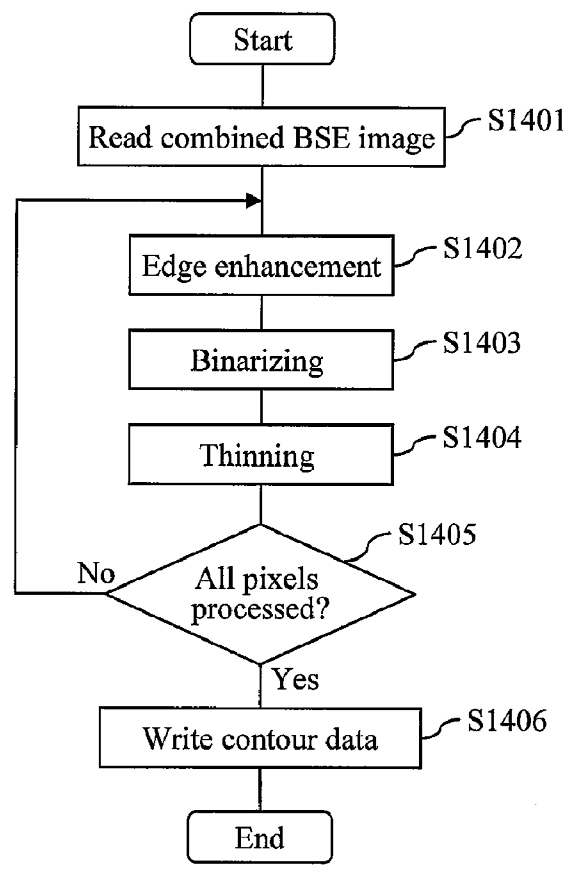
FIG. 14 is a flowchart showing details of contour line extraction processing (S504).

Processing for extracting a contour line from BSE images after combining the BSE images (step S504 in FIG. 5) will be described in detail. FIG. 14 is a flowchart for explaining contour line extraction processing. For contour line extraction, the method of detecting a white line in an image and the method of detecting a portion where the luminance changes stepwise in an image exist, as described above. The detection methods may be changed only by changing edge enhancement processing in the process shown in the flowchart. Steps of this processing will be described.

Referring to FIG. 14, the processing control section 115 first reads a combined BSE image in the image memory 152 (S1401). The processing control section 115 subsequently forms, by edge enhancement processing, an image in which the edge of a pattern element contained in the combined BSE image is enhanced (hereinafter referred to as "edge image") (S1402). Use of the edge image facilitates pattern contour line extraction.

In the case where BSE images are combined so that a white line is formed from a pattern portion, an edge image in which a white line is enhanced can be formed from the combined BSE image, for example, by filtering processing using a line detecting operator such as that disclosed in the section for extraction of an image feature and detection of a line in "Computer Image Processing" (written by Hideyuki Tamura). In the case where BSE images are combined so that a portion where the luminance changes stepwise is formed from a pattern, an edge image in which a portion where the luminance changes stepwise is enhanced can be formed from the combined BSE image, for example, by filtering processing using an edge detecting operator such as that disclosed in the section for extraction of an image feature and detection of an edge on the basis of a gradient in "Computer Image Processing". Thus, an image in which an edge of a pattern element is enhanced can be formed by selecting from different kinds of edge enhancement processing according to the state of a luminance distribution over the pattern element obtained by combining a plurality of BSE images (a white line or a portion where the luminance changes stepwise).

Figure 15:
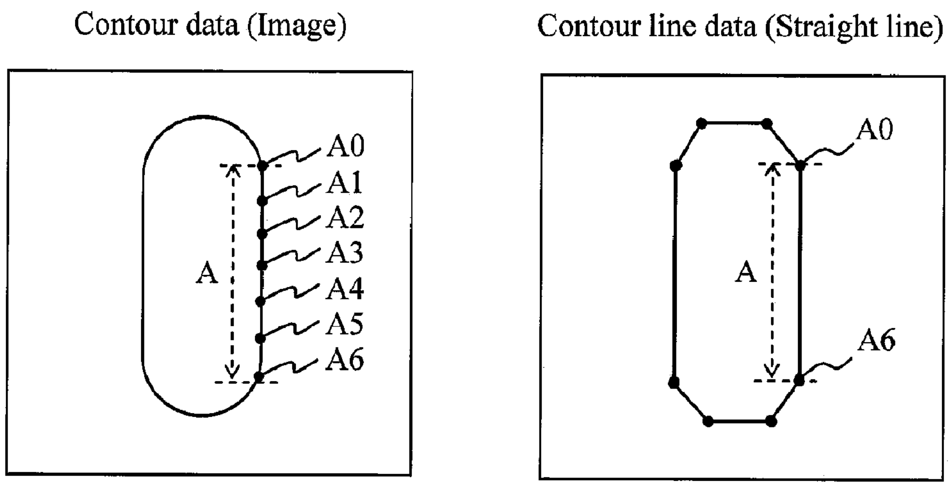
FIG. 15 is a diagram showing contour data extracted from a combined backscattered electron image.

Subsequently, the processing control section 115 performs binarization processing (S1403) and thinning processing on an edge image (S1404) disclosed in the section for binary image processing in "Computer Image Processing" to form pattern contour data such as shown in FIG. 15. When processing on all the pixels is performed (S1405), the contour data is stored in the image memory 152 (S1460). A0 to A6 in FIG. 15 represent coordinate information on the contour line position in section A.

While contour data in the description of the present embodiment expresses a pattern contour line position in an image as coordinate information on a pixel-by-pixel basis, sub-pixel position estimation processing by a fitting function, e.g., one disclosed in the section for detection of a pattern element and a figure in "Digital Image Processing" complied under the supervision of the Digital Image Processing Editing Committee (Computer Graphic Arts Society, March 2006) is performed on edge images. This processing enables forming contour data expressing a pattern contour line position as coordinate information of less than one pixel and determining the pattern contour line position with high accuracy. Further, processing for line approximation of a line figure such as that disclosed with respect to binary image processing in "Computer Image Processing" may be applied to contour data detected by thinning and sub-pixel position estimation or the like to reduce the amount of information formed as contour data. For example, there is a need to hold all the pixel coordinates (A0 to A6) of the contour line position with respect to section A of a contour line such as shown in FIG. 15 if the contour line is treated as coordinate information on a pixel-by-pixel basis. However, if the contour line is approximated as a straight line, holding only the pixel coordinates (A0 and A6) of the starting and end points of the straight line may suffice. A reduction in the amount of contour line data can be achieved in this way.

Pattern contour data is generated from a combined BDE image by the above-described contour line extraction processing. While an example of combining a plurality of BSE images has been described as a means for generating contour line data from a plurality of BSE images, contour data may be generated in a different way. For example, a process may be performed in which the above-described contour line extraction is performed with respect to a plurality of BSE images and the results of the contour line extraction are combined. Contour data is a diagram showing the existence/nonexistence of a contour at each of coordinates on an image, and can therefore be generated by referring to a plurality of groups of contour data and selecting, as a combining result, only image portions in which contours exist.

(7) About Pattern Inspection Processing (S505)

Processing for examining a pattern by comparing contour data and design data (S505) will be described below in detail.

Figure 16:
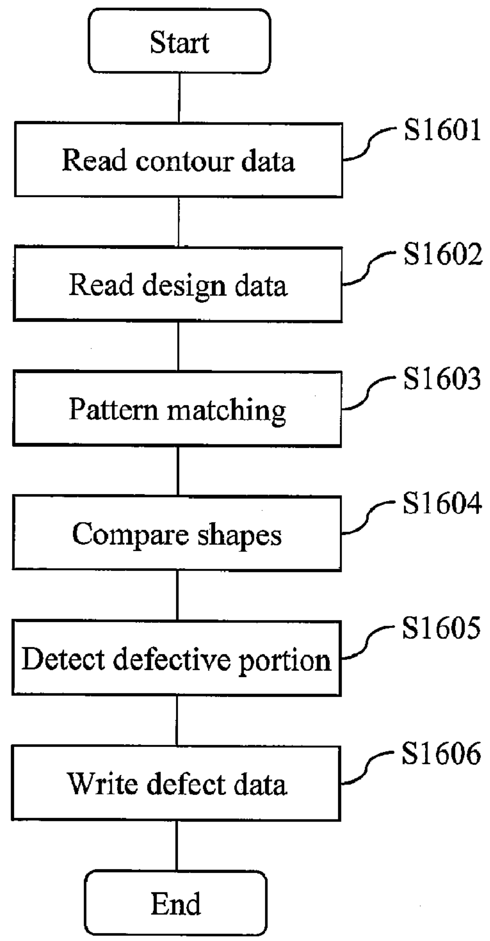
FIG. 16 is a flowchart showing details of comparison examination processing using design data and contour data (S505).

FIG. 16 is a flowchart for explaining pattern inspection processing in detail. The processing control section 115 first reads contour data from the image memory 152 (S1601) and a template of design data registered in the image taking recipe preparation system 125 (S1602).

Figure 17A:
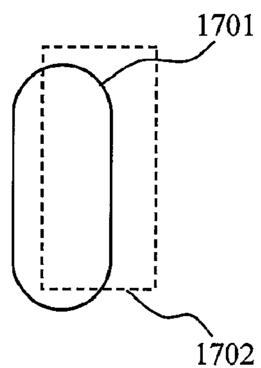
FIGS. 17A and 17B are diagrams showing a positional relationship between design data and contour data when a view field misalignment exists and a positional relationship between design data and contour data in a case where position correction is made by pattern matching.
Figure 17B:
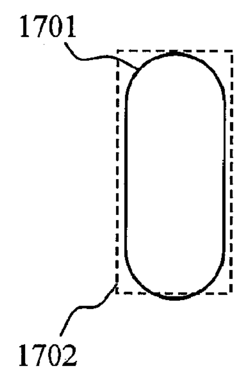

Next, the processing control section 115 determines an examination position by pattern matching (S1603). The reason for determining an examination position is because an SEM view field misalignment occurs due to an SEM stage accuracy problem for example, as described above. Comparison between a pattern element according to contour data and design data without positioning is, for example, as shown in FIG. 17A. In such a case, it is difficult to compare design data 1702 and the shape of a pattern element according to contour data 1701. Therefore, examination based on comparison of the shape of the pattern element is performed after determining an examination position by pattern patching, as shown in FIG. 17B. A normalized correlation method and a minimal residual method for example are generally known as a pattern matching method. However, such methods are based on detecting a detection position at which the shapes of pattern elements generally conform to each other, and entail difficulty in performing positioning in a case where, as shown in FIGS. 17A and B, design data 1702 and the shape of a pattern element according to contour data 1701 differ from each other to some degree. For this reason, the shape according to the design data is adjusted to the shape of the pattern element on the wafer and an examination position is thereafter determined by pattern matching based on normalized correlation, as disclosed in JP Patent Publication (Kokai) No. 6-96214 (1994). As a result, positioning can be performed with accuracy even in a case where the shape of a pattern element differs from that for comparison.

Figure 18A:
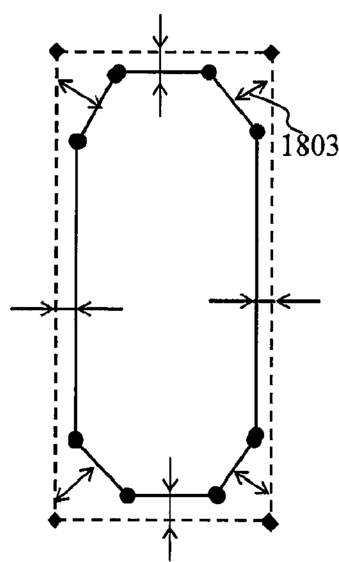
FIGS. 18A to 18C are diagrams showing an example of shape comparison between design data and contour data.
Figure 18B:
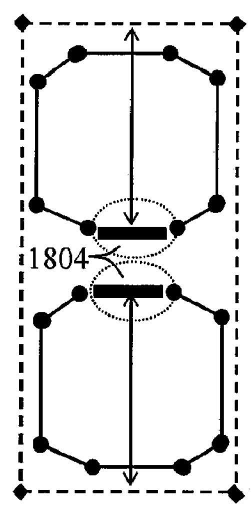
Figure 18C:
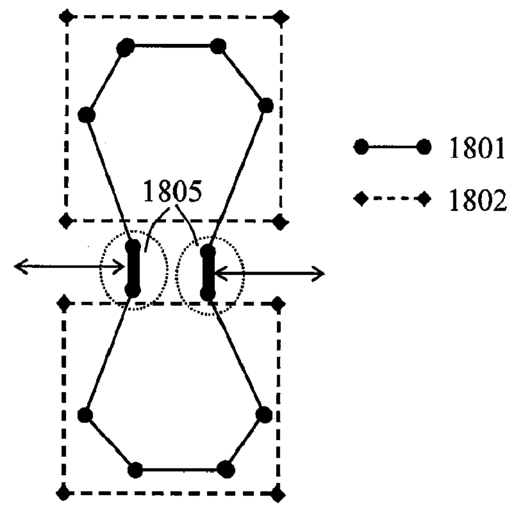

Subsequently, the processing control section 115 compares the design data and the shape of the pattern element according to the contour data (S1604) and detects as a defect data a portion having a large difference in shape from the design data (S1605). For example, as shown in FIG. 18, comparison of the shape of the pattern element can be realized by measuring the distance between design data 1802 and a contour line 1801 prepared as straight-line data by the above-described line approximation processing. The form of ordinary design data is such that the coordinates of the starting and end points of a straight line constituting a pattern element are defined. Accordingly, the state of difference between the design data and the shape of the pattern element can be estimated, for example, by measuring the distance 1803 between each of the starting points, the midpoints and the end points of straight lines of the contour data and the corresponding straight line of the design data existing in a direction normal to the straight line of the contour data, as shown in FIG. 18. A disconnection of the pattern element, such as shown in FIG. B, a short circuit of the pattern element, such as shown in FIG. 18C, or a portion having a large difference in shape from the design data can be detected by detecting a contour line portion having a distance out of a certain range as a defect.

Data (shape information such as a coordinate position and a length) on a defect in the pattern element detected by comparison between the design data and the shape of the pattern element according to the contour data as described above is written to the image memory (S1606).

Figure 19:
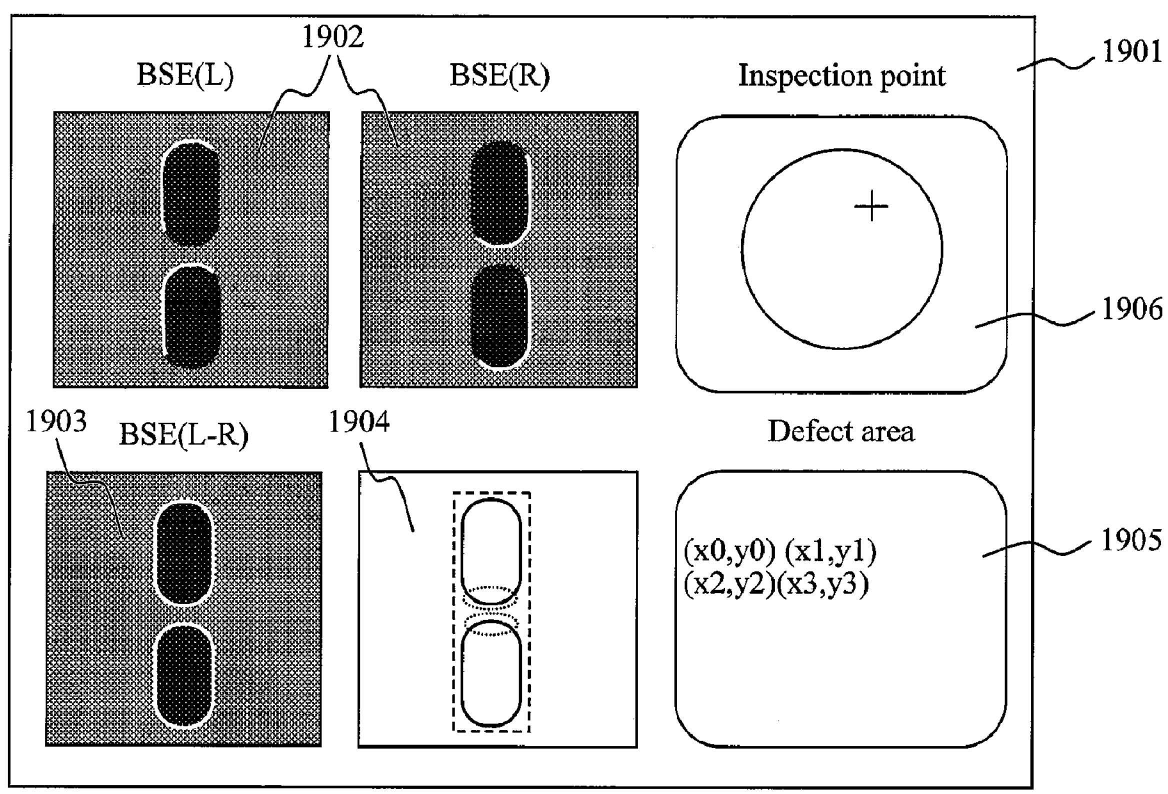
FIG. 19 is a diagram showing an on-screen display for informing a user of the state of pattern inspection and examination results.

As shown in FIG. 19, BSE image 1092, a combined BSE image 1903, contour line and design data 1904, defect data 1905 and a measurement points 1906 on a wafer may be displayed on a display 1901 of the above-described electronic computer 116 (see FIG. 1) to provide the examination results and the progress of examination to a user.

(8) Summary of the First Embodiment

According to the present embodiment, as described above, a contour line of a pattern element necessary for examination of a semiconductor circuit based on design data is extracted from an image obtained by combining a plurality of BSE images taken from two or more points about the pattern element. As a result, the occurrence of erroneous detection of a contour line position under the influence of a disturbance in an image due to electrification caused when an SE image is used in semiconductor examination can be reduced and design data and a pattern element can be examined with accuracy.

While a pattern on a wafer is examined in the present embodiment, the present invention is also effective in examination of a lithography mask pattern made from semiconductor circuit design data. The structure of masks presently used in most cases is such that a pattern is formed on a glass member, which is an insulating material, by using chromium, which is a conductor. The glass is electrified by irradiation with an electron beam accompanying pattern inspection to badly influence pattern inspection. Also, in examination of a resist pattern in the course of making a mask, the resist pattern is electrified. It is apparent that the present invention is effective in examining such a mask easily electrifiable.

Figure 20:
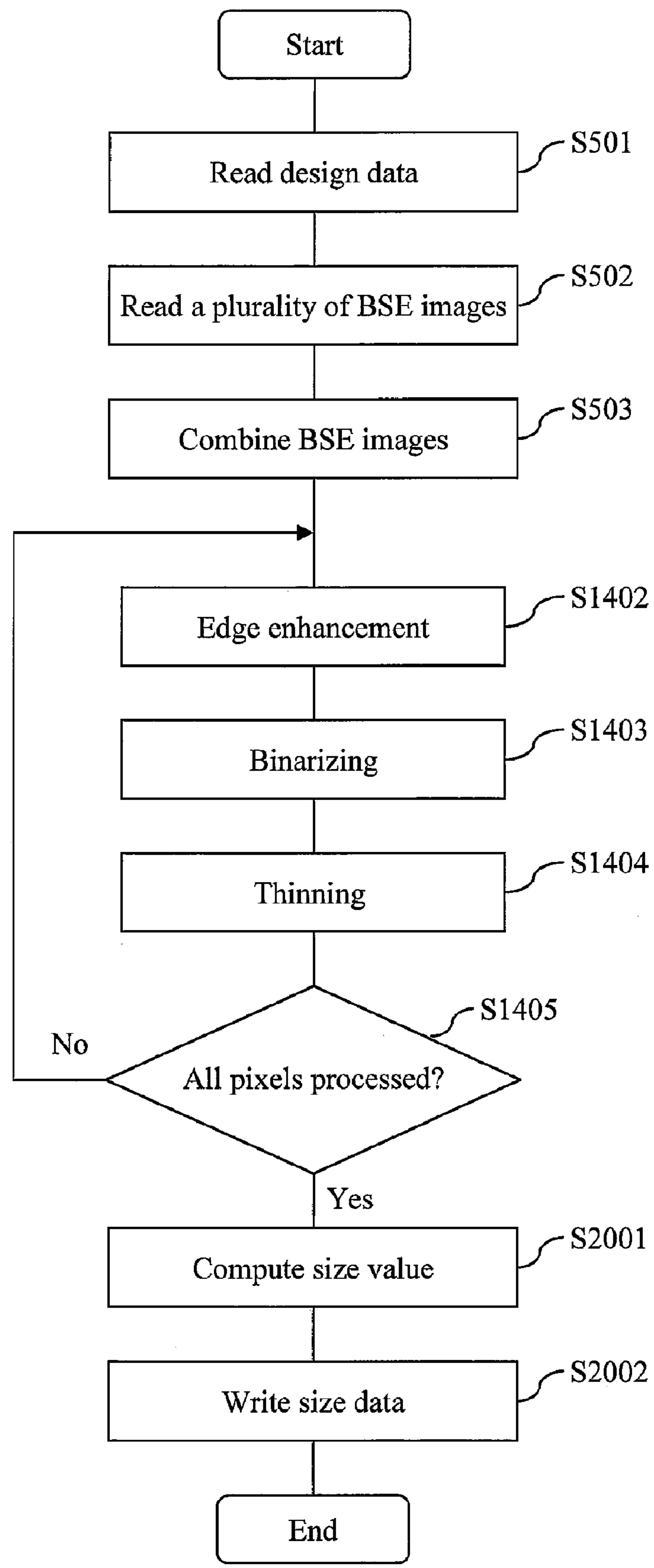
FIG. 20 is a flowchart in a case where only size measurement is performed.

The pattern contour extraction method according to the present embodiment is also effective in computing a pattern size or a pattern spacing size with good reproducibility. In this case, reference to semiconductor circuit design data is not necessarily required. Processing is performed as shown in the flowchart of FIG. 20. After extraction of a contour line, measurement (S2001) and writing (S2002) of a size value are performed. Thus, use of the contour line extraction method according to the present embodiment enables an image having a definite contour to be obtained even in examination using an insulating member easily electrifiable and a large current. If distance measurement is performed by using this image, size measurement can be performed by utilizing electrification robustness which is an advantage of the present invention.

Second Embodiment (1) Pattern Inspection Processing

Figure 21:
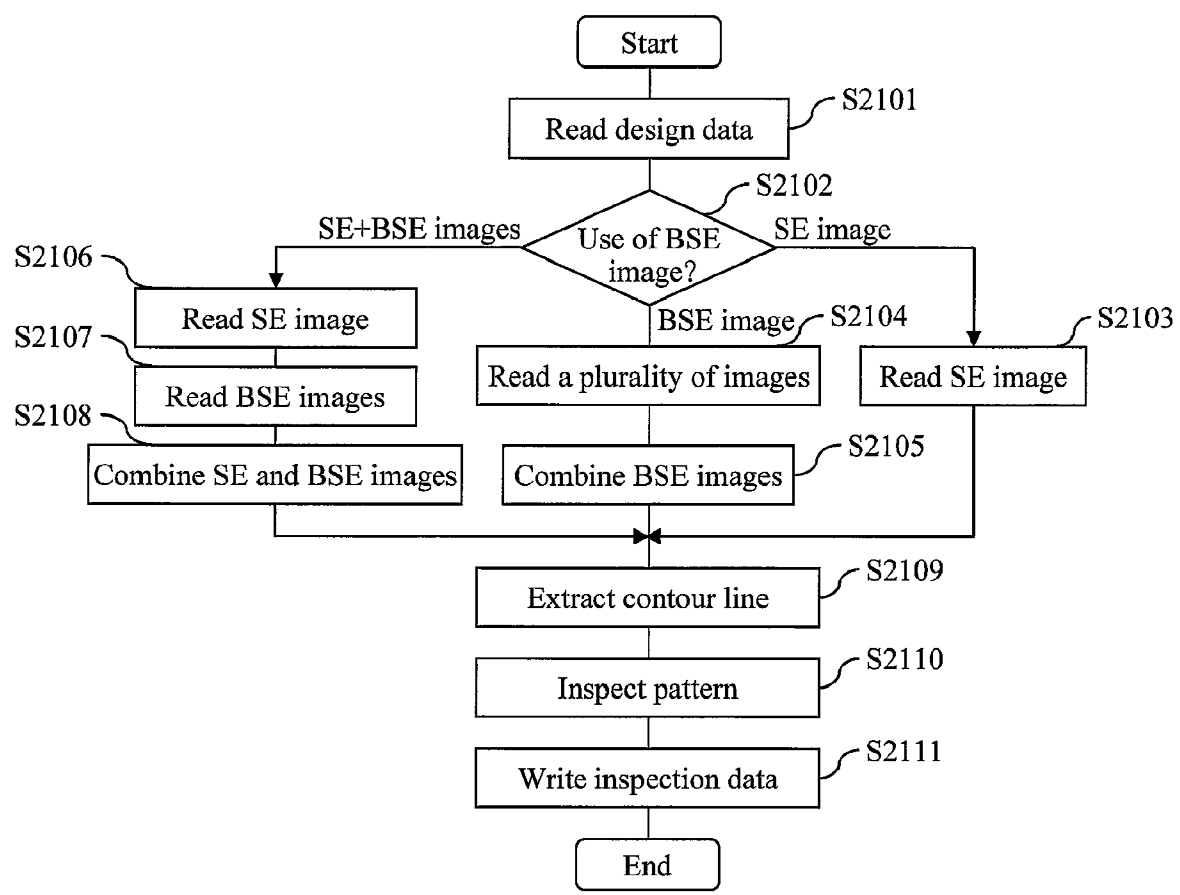
FIG. 21 is a flowchart for explaining pattern inspection processing according to a second embodiment of the present invention.

FIG. 21 is a flowchart for explaining pattern inspection processing according to a second embodiment of the present invention. Pattern inspection method according to the second embodiment is characterized in that an object from which a contour line to be used for comparison with design data is to be extracted can be selected from BSE images and an SE image.

Figures 22A, 22B, 22C, 22D, 22E:
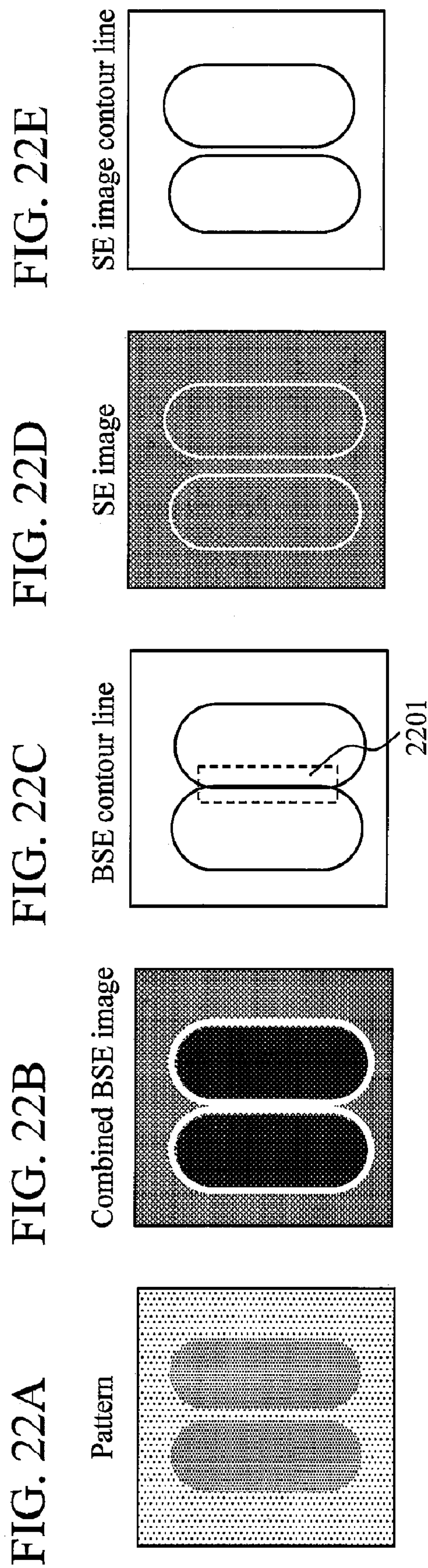
FIGS. 22A to 22E are diagrams showing the difference between a combined backscattered electron image and a secondary electron image.

A BSE image can be said to be an image suitable for contour line extraction because it is not easily affected by electrification in comparison with an SE image. In some case, however, an SE image can be obtained as an image more advantageous in contour line extraction, depending on SEM observation conditions, and wafer conditions including the wafer material and a manufacturing step condition. For example, in a case where pattern inspection is performed by taking BSE images in a high-pattern-density area at a low magnification as shown in FIG. 22A, there is a possibility of each of pattern element portions of the BSE images being formed so as to have, as shown in FIG. 22B, a wider white line width (contour line increased in thickness) relative to that in an SE image (FIG. 22D) taken from the same area. When combining processing using such BSE images is performed to leave the white lines of the pattern element portions, the white lines of the pattern elements adjacent to each other overlap each other as shown in FIG. 22B so that the contour line of in a portion 2201 indicated by the broken line in FIG. 22C cannot be accurately extracted (the contour lines to be recognized as two are extracted as one contour line) and the comparison of the resulting image with the design data is difficult to make. Electrification, which is a consideration with respect to an SE image, occurs as a result of irradiation of the semiconductor pattern with a large amount of electron beam, for example, when the SEM current value is high and/or the observation magnification is high. Therefore, in a case where pattern inspection is performed by taking images at a low magnification from an area where the pattern element density is high, the influence of electrification is reduced and a pattern element contour line can be accurately extracted even by using an SE image, as shown in FIG. 22E, thus enabling comparison with the design data. If each of B SE images and an SE image contain pattern information effective in the above-described contour line extraction, combining processing such as that described above may be performed between the SE image and the BSE images to form an image effective in contour line extraction.

Referring to FIG. 21, the processing control section 115 first reads a design data template corresponding to the coordinates of an EP from the image taking recipe preparation system 125 (S2101). Subsequently, the processing control section 115 determines, according to a command from a user, which one of an SE image, BSE images, and an image obtained by combining the SE and BSE images is to be used in execution of pattern inspection (S2102).

If execution of examination using the SE image is designated, the processing control section 115 reads out the SE image from the image memory 152 (S2103).

If execution of examination using the BSE images is designated, the processing control section 115 reads out the BSE images from the image memory 152 (S2104) and combines the BSE images (S2105).

If execution of examination using a combined image of the SE image and BSE images is designated, the processing control section 115 reads out the SE and BSE images from the image memory 152 (S2106 and S2107) and combines the SE and BSE images (S2108).

The processing control section 115 extracts a contour line from the combined image obtained in step S2103, S2105 or S2108 (S2109) and examines the pattern by comparing the contour data and the design data (S2110). Data (shape information such as a coordinate position and a length) on a defect in the pattern detected by comparison between the design data and the configuration of the pattern according to the contour data as described above is written to the storage 123 for example (S2111). To image combining processing (S2105 or S2108) and contour extraction processing (S2109), the corresponding processings described in the description of the first embodiment can be applied.

(2) Summary of the Second Embodiment

As described above, pattern inspection using design data can be performed with stability by changing, according to SEM image taking conditions and wafer conditions, images from one of which a contour line should be extracted.

Selection of one of images from which a contour line should be extracted is executed on the basis of a user designation given through the electronic computer 116 connected to the processing control section 115 according to the description with reference to the flowchart of FIG. 21. A different process is conceivable in which images to be processed, advantageous in contour line extraction according to image taking conditions and wafer conditions, are empirically obtained and held as table information in the processing control section 115 as shown in FIG. 23, and a selection of one of the images from which a contour line should be extracted is made according to information including image taking conditions and wafer conditions from the SEM and the image taking recipe generation section. When an image taking recipe is prepared in the image taking recipe preparation section 125, parameters enabling the processing control section 115 to select one of the images from which a contour line should be extracted may be registered in the image taking recipe.

According to the present embodiment, as described above, one of an SE image and BSE images can be selected as an image from which a contour line in a pattern should be extracted to be used in semiconductor circuit examination based on design data; a contour line is extracted from the selected image; and examination by comparison with the design data is performed, thus enabling selection of an image effective in contour line extraction, which is changed depending on SEM image taking conditions and wafer conditions, and enabling examination using a correct pattern contour line.

Other Embodiments

The present invention can also be implemented by means of a program code of software capable of realizing the functions of the embodiment. In the case of using such a program code, a storage medium on which the program code is recorded is provided to a system or a unit, and a computer (or a CPU or an MPU) in the system or the unit reads out the program code stored in the storage medium. In this case, the program code itself, read out from the storage medium, realizes the functions of the above-described embodiment, and the program code itself and the storage medium on which the program code is stored constitute the present invention. As the storage medium for supplying such a program code, a floppy (registered trademark) disk, a CD-ROM, a DVD-ROM, a hard disk, an optical disk, a magneto-optical disk, a CD-R, a magnetic tape, a nonvolatile memory card or a ROM for example is used.

Also, an operating system (OS) running on the computer may perform part or the whole of the actual processing on the basis of instructions from the program code, and the functions of the above-described embodiment may be realized by the processing. Further, after the program code read out from the storage medium has been written to a memory on the computer, the CPU or the like of the computer may perform part or the whole of the actual processing to realize the functions of the above-described embodiment by the processing.

Also, the program code of the software capable of realizing the functions of the embodiment may be distributed via a network. The program code is thereby stored in a storage means such as a hard disk or a memory in the system or unit, or on a storage medium such as a CD-RW or a CD-R. The computer (or a CPU or an MPU) in the system or unit may read out the program code stored in the storage means or on the storage medium and execute the program code to achieve the functions of the embodiment.

What is claimed is:

1. A pattern inspection method in which a circuit pattern on a specimen manufactured on the basis of design data for an electronic device is examined by comparison between the design data and an image of the circuit pattern, the method comprising:

a step in which the specimen is irradiated with an electron beam, backscattered electrons emitted from the specimen are detected by a backscattered electron detector, and backscattered electron image forming means forms a backscattered electron image by using the detected backscattered electrons; and a step in which contour extraction means extracts contour data on a contour in the circuit pattern from the backscattered electron image formed.

2. The pattern inspection method according to claim 1, wherein, in the step of forming the backscattered electron image, at least two backscattered electron detectors detect the backscattered electrons at different spatial positions and the backscattered electron image forming means forms at least two backscattered electron images, and wherein, in the step of extracting the contour data, the contour extraction means extracts the contour data on the contour in the circuit pattern from a combined image formed by combining the at least two backscattered electron images.

3. The pattern inspection method according to claim 2, wherein, in the step of extracting the contour data, the contour extraction means forms the combined image of the backscattered electrons by inter-image computational processing on the at least two backscattered electron images and extracts the contour data on the contour in the circuit pattern contained in the combined image of the backscattered electrons.

4. The pattern inspection method according to claim 3, wherein the inter-image computational processing includes 1) first computational processing for comparing the at least two backscattered electron images and selecting the backscattered electron image having a higher gray-level value as the combined image of the backscattered electrons, 2) second computational processing for comparing the at least two backscattered electron images and selecting the backscattered electron image having a lower gray-level value as the combined image of the backscattered electrons, and 3) third computational processing for generating a gray-level value of the combined image of the backscattered electrons by adding together the gray-level values of the at least two backscattered electron images in even or uneven proportions, and wherein the contour extraction means forms the combined image of the backscattered electrons by using one of the first to third computational processings and extracts a contour in the combined image.

5. A pattern inspection method in which a circuit pattern on a specimen manufactured on the basis of design data for an electronic device is examined by comparison between the design data and an image of the circuit pattern, the method comprising:

a step in which the specimen is irradiated with an electron beam, backscattered electrons emitted from the specimen are detected by a backscattered electron detector, and backscattered electron image forming means forms a backscattered electron image by using the detected backscattered electrons;

a step in which secondary electrons emitted from the specimen are detected by secondary electron detector, and secondary electron image forming means forms a secondary electron image by using the detected secondary electrons; and a step in which contour extraction means extracts contour data on a contour in the circuit pattern from the backscattered electron image and the secondary electron image.

6. The pattern inspection method according to claim 5, wherein, in the step of forming the backscattered electron image, at least two backscattered electron detectors detect the backscattered electrons at different spatial positions and the backscattered electron image forming means forms at least two backscattered electron images, and wherein, in the step of extracting the contour data, the contour extraction means forms a combined image from the at least two backscattered electron images and the secondary electron image by using inter-image computational processing, and extracts the contour data on the contour in the circuit pattern from the combined image.

7. The pattern inspection method according to claim 6, wherein the inter-image computational processing includes 1) first computational processing for comparing the at least two backscattered electron images and the secondary electron image and selecting the backscattered electron image having a higher gray-level value or the secondary electron image as the combined image of the backscattered electrons, 2) second computational processing for comparing the at least two backscattered electron images and the secondary electron image and selecting the backscattered electron image having a lower gray-level value or the secondary electron image as the combined image of the backscattered electrons, and 3) third computational processing for forming the combined image of the backscattered electrons by adding together the gray-level values of the at least two backscattered electron images and the secondary electron image in even or uneven proportions, and wherein the contour extraction means forms the combined image of the backscattered electrons by using one of the first to third computational processings and extracts a contour in the combined image.

8. A pattern inspection system in which a circuit pattern on a specimen manufactured on the basis of design data for an electronic device is examined by comparison between the design data and an image of the circuit pattern, the system comprising:

a backscattered electron detector which detects backscattered electrons emitted from the specimen by irradiating the specimen with an electron beam;

backscattered electron image forming means of forming a backscattered electron image by using the detected backscattered electrons; and contour extraction means of extracting contour data on a contour in the circuit pattern from the backscattered electron image formed.

9. The pattern inspection method according to claim 8, wherein the backscattered electron detector comprises at least two backscattered electron detectors which detect the backscattered electrons at different spatial positions; the backscattered electron image forming means forms at least two backscattered electron images; and the contour extraction means extracts the contour data on the contour in the circuit pattern from a combined image formed by combining the at least two backscattered electron images.

10. The pattern inspection system according to claim 9, wherein the contour extraction means forms the combined image of the backscattered electrons by inter-image computational processing on the at least two backscattered electron images and extracts the contour data on the contour in the circuit pattern contained in the combined image of the backscattered electrons.

11. A pattern inspection system in which a circuit pattern on a specimen manufactured on the basis of design data for an electronic device is examined by comparison between the design data and an image of the circuit pattern, the system comprising:

a backscattered electron detector which detects backscattered electrons emitted from the specimen by irradiating the specimen with an electron beam;

backscattered electron image forming means of forming a backscattered electron image by using the detected backscattered electrons;

a secondary electron detector which detects the secondary electrons emitted from the specimen;

secondary electron image forming means of forming a secondary electron image by using the detected secondary electrons; and contour extraction means of extracting contour data on a contour in the circuit pattern from the backscattered electron image and the secondary electron image.

12. The pattern inspection method according to claim 11, wherein the backscattered electron detector comprises at least two backscattered electron detectors which detect the backscattered electrons at different spatial positions; the backscattered electron image forming means forms at least two backscattered electron images; and the contour extraction means forms a combined image from the at least two backscattered electron images and the secondary electron image by using inter-image computational processing, and extracts the contour data on the contour in the circuit pattern from the combined image.

13. The pattern inspection system according to claim 12, wherein the inter-image computational processing includes 1) first computational processing for comparing the at least two backscattered electron images and the secondary electron image and selecting the backscattered electron image having a higher gray-level value or the secondary electron image as the combined image of the backscattered electrons, 2) second computational processing for comparing the at least two backscattered electron images and the secondary electron image and selecting the backscattered electron image having a lower gray-level value or the secondary electron image as the combined image of the backscattered electrons, and 3) third computational processing for forming the combined image of the backscattered electrons by adding together the gray-level values of the at least two backscattered electron images and the secondary electron image in even or uneven proportions, and wherein the contour extraction means forms the combined image of the backscattered electrons by using one of the first to third computational processings and extracts a contour in the combined image.

14. The pattern inspection system according to claim 11, further comprising pattern inspection means which measures a difference between the contour data and the pattern according to the design data and detects a portion of the pattern as a defective portion if the portion has as the measured value a value larger than a prescribed value.

15. The pattern inspection system according to claim 11, further comprising pattern inspection means which computes a circuit pattern size or a circuit pattern spacing size on the specimen from the contour data.

16. The pattern inspection system according to claim 8, further comprising display control means of displaying the backscattered electron image, the contour data and the design data in a state of being overlaid on each other or arranged side by side on a screen of a display unit.

17. The pattern inspection system according to claim 8, wherein the specimen is a mask or a silicon wafer.

18. The pattern inspection system according to claim 9, wherein the at least two backscattered electron detectors are disposed at substantially equal intervals so as to surround the specimen.

19. The pattern inspection system according to claim 18, wherein three backscattered electron detectors are provided and disposed at intervals of about 120 degrees from each other.

20. The pattern inspection system according to claim 10, wherein the inter-image computational processing includes smoothing of the combined image, whereby noise superimposed on the combined image is reduced and luminance-changed portions of the pattern in the combined image are reduced.

* * * * *